United States Patent
Vance

(10) Patent No.: US 7,161,544 B2
(45) Date of Patent: Jan. 9, 2007

(54) MOBILE TERMINALS INCLUDING A BUILT-IN RADIO FREQUENCY TEST INTERFACE

(75) Inventor: Scott L. Vance, Cary, NC (US)

(73) Assignee: Sony Ericsson Mobile Communications, Lund (SE)

( * ) Notice: Subject to any disclaimer, the term of this patent is extended or adjusted under 35 U.S.C. 154(b) by 106 days.

(21) Appl. No.: 11/024,595

(22) Filed: Dec. 29, 2004

(65) Prior Publication Data
US 2006/0139217 A1 Jun. 29, 2006

(51) Int. Cl.
*H01Q 1/24* (2006.01)
*H01R 29/00* (2006.01)

(52) U.S. Cl. .................. 343/702; 343/703; 438/188

(58) Field of Classification Search ............... 343/702, 343/703, 906; 438/188, 246, 247, 248
See application file for complete search history.

(56) References Cited

U.S. PATENT DOCUMENTS 6,426,724 B1 * 7/2002 Gunee et al. ............... 343/702
6,473,045 B1 * 10/2002 Duquerroy et al. ......... 343/702
6,943,739 B1 * 9/2005 Rousu et al. ............... 343/702
2002/0025707 A1 * 2/2002 Hida .......................... 439/188
2004/0175978 A1 9/2004 Mugiuda et al.

FOREIGN PATENT DOCUMENTS

EP 0 678 749 10/1995

OTHER PUBLICATIONS

International Search Report and Written Opinion of the International Searching Authority for International Patent Application No. PCT/US2005/028117 mailed on Dec. 13, 2005.

* cited by examiner

*Primary Examiner*—Tho Phan
(74) *Attorney, Agent, or Firm*—Myers Bigel Sibley & Sajovec, PA

(57) ABSTRACT

A radio frequency test interface for an electronic device includes a circuit board that includes a radio frequency contact. An antenna includes a resilient member that urges the antenna to engage the radio frequency contact. A test connector includes a conductive contact and is configured to engage the resilient member so as to displace the antenna from the radio frequency contact to allow the conductive contact to engage the radio frequency contact.

21 Claims, 4 Drawing Sheets

MOBILE TERMINALS INCLUDING A BUILT-IN RADIO FREQUENCY TEST INTERFACE

BACKGROUND OF THE INVENTION

The present invention relates to electronic devices, such as mobile terminals, and more particularly, radio frequency test interfaces for electronic devices, such as mobile terminals.

External antenna connectors may facilitate testing of electronic devices, such as mobile terminals, by a allowing a technician to test the radio frequency performance of a device without removing the antenna. For example, FIG. 1A illustrates a conventional external antenna connector 100 that may be included on an electronic device to test the radio frequency performance of the device. The connector 100 includes an interface 110 for receiving a radio frequency test probe and radio frequency contacts 120 and ground contacts 130, which may connect to the radio frequency and ground contacts, respectively, on a printed circuit board, for example. FIG. 1B provides another view of the radio frequency contacts 120 and the ground contacts 130. Unfortunately, the connector 100 may cost about $0.15 per unit, which can be a significant expense when produced for millions of electronic devices, such as cellular phones and other mobile terminals that use radio frequency communications technology.

SUMMARY OF THE INVENTION

In some embodiments of the present invention, a radio frequency test interface for an electronic device includes a circuit board that includes a radio frequency contact and has an opening that extends therethrough. An antenna is configured to engage the radio frequency contact. A test connector includes a conductive contact that is configured to engage the radio frequency contact and a non-conductive post that is configured to be received through the opening in the circuit board to disengage the antenna from the radio frequency contact.

In other embodiments of the present invention, the radio frequency contact extends through the circuit board and the conductive contact is configured to engage the radio frequency contact on a first side of the circuit board and the antenna is configured to engage the radio frequency contact on a second side of the circuit board.

In other embodiments of the present invention, the antenna is a leaf-spring antenna.

In other embodiments of the present invention, the test connector is a spring-loaded test connector.

In other embodiments of the present invention, the circuit board further includes a ground contact and the conductive contact is a first conductive contact and the test connector further includes a second conductive contact that is configured to engage the ground contact.

In other embodiments of the present invention, the circuit board further includes a matching component contact. The antenna includes a first portion that is configured to engage the radio frequency contact and a second portion that is configured to engage the matching component contact. The non-conductive post is configured to be received through the opening in the circuit board to disengage the first antenna portion from the radio frequency contact and the second antenna portion from the matching component contact.

In other embodiments of the present invention, the circuit board further includes a ground contact. The antenna includes a first portion that is configured to engage the radio frequency contact and a second portion that is configured to engage the ground contact. The non-conductive post is configured to be received through the opening in the circuit board to disengage the first antenna portion from the radio frequency contact without disengaging the second antenna portion from the ground contact.

In other embodiments of the present invention, the antenna is a planar inverted F antenna.

In other embodiments of the present invention, the test connector is a 50 ohm test connector.

In other embodiments of the present invention, the electronic device is a mobile terminal.

In further embodiments of the present invention, a radio frequency test interface for an electronic device includes a circuit board that includes a radio frequency contact. An antenna includes a resilient member that urges the antenna to engage the radio frequency contact. A test connector includes a conductive contact and is configured to engage the resilient member so as to displace the antenna from the radio frequency contact to allow the conductive contact to engage the radio frequency contact.

In still further embodiments of the present invention, the resilient member includes a tapered portion and the test connector is configured to engage the tapered portion of the resilient member.

In still further embodiments of the present invention, an alignment structure is configured to receive the test connector therethrough so as to position the conductive contact in alignment with the radio frequency contact.

In still further embodiments of the present invention, the alignment structure comprises an opening in a housing of the electronic device.

In still further embodiments of the present invention, the circuit board further includes a ground contact and the conductive contact is a first conductive contact. The test connector further includes a second conductive contact that is configured to engage the ground contact.

In still further embodiments of the present invention, the circuit board further includes a matching component contact. The antenna includes a first portion that is configured to engage the radio frequency contact and a second portion that is configured to engage the matching component contact. The test connector is configured to engage the resilient member so as to displace the first antenna portion from the radio frequency contact and to displace the second antenna portion from the matching component contact.

In still further embodiments of the present invention, the circuit board further includes a ground contact. The antenna includes a first portion that is configured to engage the radio frequency contact and a second portion that is configured to engage the ground contact. The test connector is configured to engage the resilient member so as to displace the first antenna portion from the radio frequency contact without displacing the second antenna portion from the ground contact.

In other embodiments of the present invention, a radio frequency test interface for an electronic device includes a circuit board that includes a radio frequency contact and has an opening that extends therethrough. An antenna is configured to engage the radio frequency contact. A test connector includes a non-conductive contact that is configured to engage the radio frequency contact and a conductive post that is configured to be received through the opening in the circuit board to disengage the antenna from the radio frequency contact.

DETAILED DESCRIPTION OF EXEMPLARY EMBODIMENTS

Figure 1A:
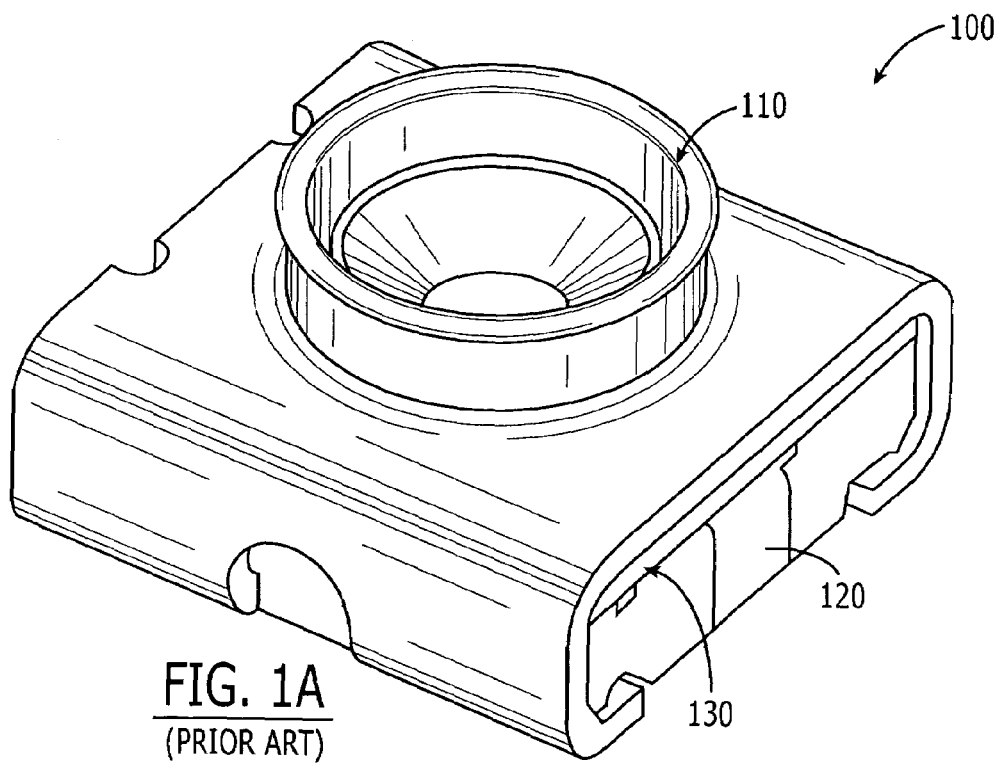
FIGS. 1A and 1B illustrate a conventional external antenna connector.
Figure 1B:
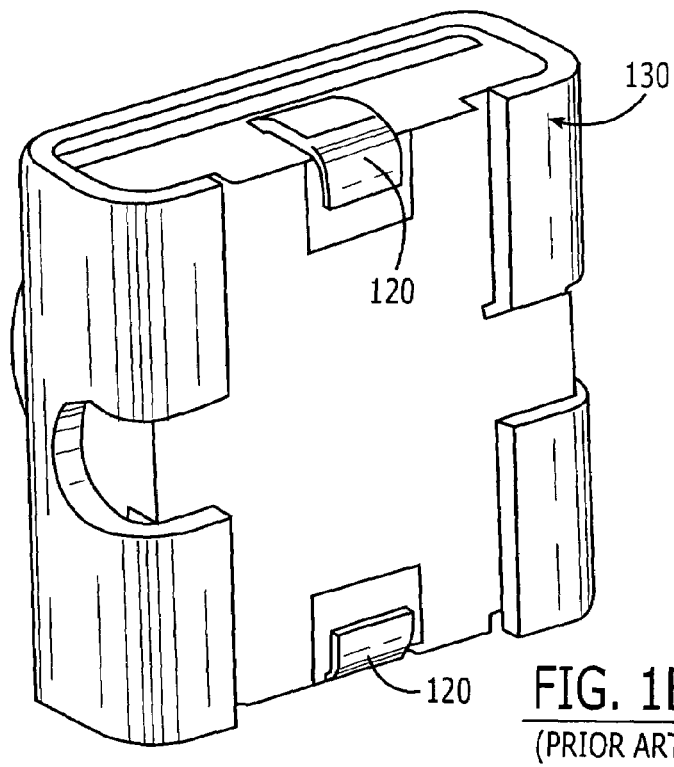

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular exemplary embodiments illustrated in the accompanying drawings is not intended to be limiting of the invention. In the drawings, like numbers refer to like elements.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "mobile terminal" may include a satellite or cellular radiotelephone with or without a multi-line display; a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver. Mobile terminals may also be referred to as "pervasive computing" devices.

Figure 2A:
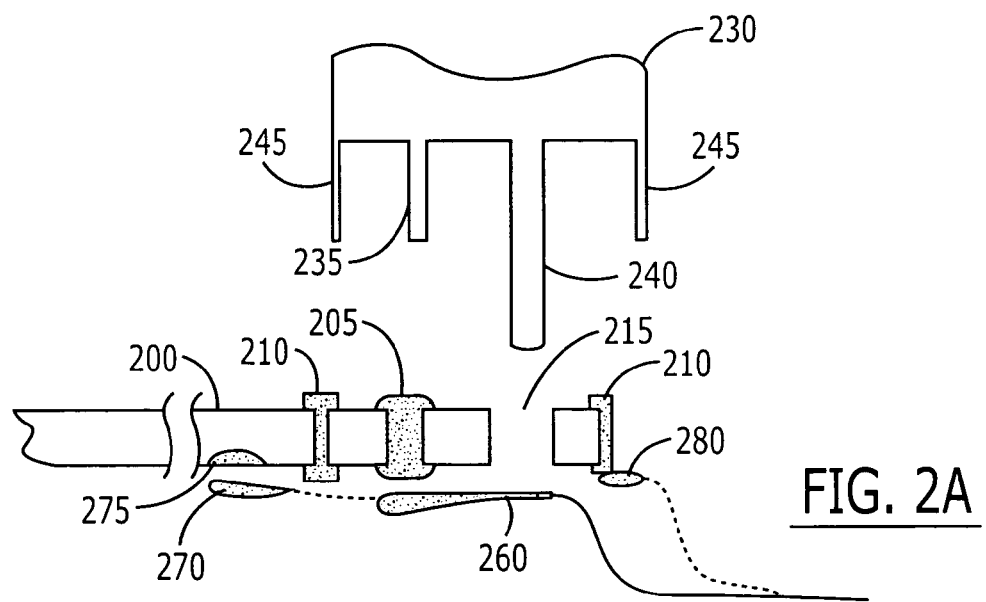
FIG. 2A–2D illustrate radio frequency test interfaces in accordance with some embodiments of the present invention.

Some embodiments of the present invention arise from a realization that the cost of electronic devices, such as mobile terminals, that incorporate radio frequency technology may be reduced by providing a built-in radio frequency test interface so that an additional radio frequency test connector may be unnecessary. Referring now to FIG. 2A, an exemplary radio frequency test interface for an electronic device, such as a mobile terminal, in accordance with some embodiments of the present invention, comprises a circuit board 200 that comprises a radio frequency contact 205, a ground contact 210, and an opening therethrough 215. The test interface also includes a test connector 230 that comprises a conductive contact 235, a non-conductive post 240, and additional conductive contacts 245. The test connector 230 may be a 50 ohm test connector in accordance with some embodiments of the present invention. An antenna 260, such as a leaf-spring antenna, may be configured to engage the radio frequency contact 205.

As shown in FIG. 2A, the test connector 230 may be inserted, for example, through the housing of an electronic device to engage the circuit board 200 to perform radio frequency testing without the need of a separate connector on the circuit board 200. Moreover, the test interface embodiments illustrated in FIG. 2A may allow the test connector 230 to disengage the antenna 260 when performing a radio frequency performance test during manufacture and/or during diagnostic service. More specifically, the non-conductive post 240 of the test connector 230 may be received through the opening 215 to disengage the antenna 260 from the radio frequency contact 205. This may allow the conductive contact 235 on the test connector 230 to engage the radio frequency contact 205 and the conductive contacts 245 on the test connector 230 to engage the ground contacts 210 for performing radio frequency testing on the electronic device. The conductive contact 235 may be spring-loaded to enhance the mechanical and electrical connection between the conductive contact 235 and the radio frequency contact 205. To facilitate the radio frequency performance testing, the circuit board 200 may be configured so as to expose the side of the circuit board 200 opposite the antenna 260 to the housing of the electronic device. For example, in some embodiments of the present invention, the side of the circuit board 200 opposite the housing may be accessed by removing a battery cover of the electronic device. In other embodiments, the external housing of the electronic device may be configured with openings to receive the conductive contact 235, the non-conductive post 240, and the additional conductive contacts 245 therethrough.

In accordance with some embodiments of the present invention, the antenna may comprise a first portion 260 that is configured to engage and be disengaged from the radio frequency contact 205 and a second portion 270 that is configured to engage and be disengaged from a matching component contact 275 on the circuit board 200. The circuit board 200 may include impedance matching components thereon that may be used to tune the antenna for improved performance. These components are typically disconnected during radio frequency testing during manufacture or diagnostic testing. Thus, the non-conductive post 240 of the test connector 230 may also disengage the second portion 270 of the antenna from the matching component contact 275 when received through the opening 215. Note, however, that in other embodiments of the present invention, the second portion 270 may remain engaged with the matching component contact 275 upon insertion of the non-conducting post 240.

In accordance with further embodiments of the present invention, the antenna may comprise a third portion 280, instead of or in addition to the second portion 270 discussed above, that is configured to engage the ground contact 210 of the circuit board 200 or to ground a parasitic radiating element. This may be particular useful when the antenna is a planar inverted-F type antenna, which is a common antenna configuration used in many types of mobile terminals. This connection between the antenna portion 280 and the ground contact 210 need not be disconnected during radio frequency testing; therefore, the antenna portion 280 is configured so as to remain engaged with the ground contact 210 when the non-conductive post 240 of the test connector 230 is received through the opening 215.

Figure 2B:
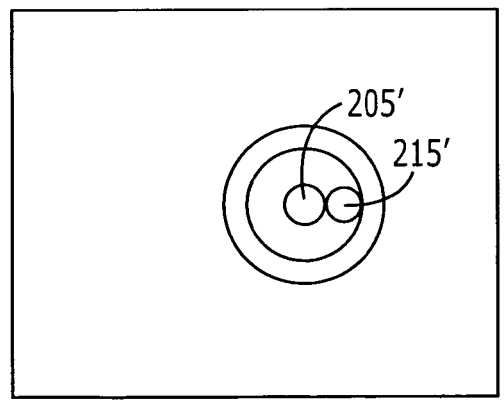
Figure 2C:
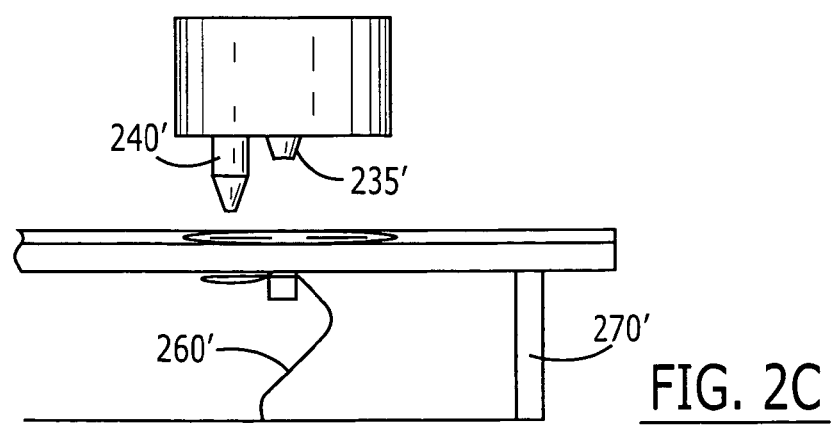
Figure 2D:
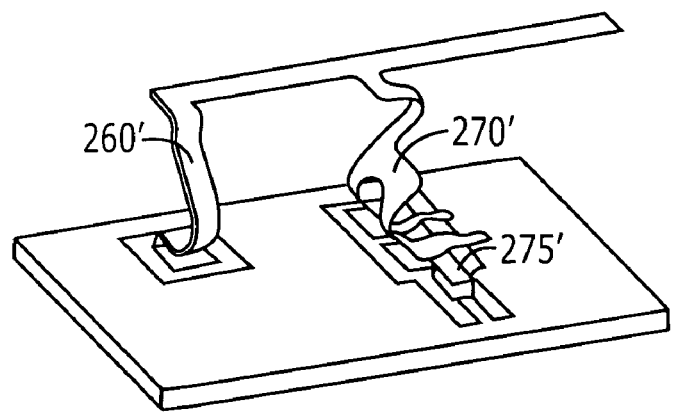

An exemplary radio frequency test interface for an electronic device, in accordance with further embodiments of the present invention will now be described with reference to FIGS. 2B–2D. As shown in FIG. 2B, a housing, for example, includes an opening 215' and a radio frequency contact 205'. The opening 215' may be configured to receive a non-conducting post 240' therethrough to disengage a first portion of an antenna or antenna connector 260' from the radio frequency contact 205' and allow the conductive contact 235' to engage the radio frequency contact 205' to perform radio frequency testing on the electronic device as shown in FIG. 2C. A second portion of the antenna or antenna connector 270 may be used to engage matching component contacts. This is illustrated in FIG. 2D where the first antenna portion or antenna contact portion 260' is shown along with a second antenna portion or antenna contact portion 270' that engages matching component contacts 275'. Note that the second antenna or antenna contact portion 270' may remain engaged with the matching component contact 275' upon insertion of the non-conducting post 240' or may disengage from the matching component contact 275' upon insertion of the non-conducting post 240' in accordance with various embodiments of the present invention.

Referring again to FIG. 2A, in accordance with other embodiments of the present invention, the functionality of the non-conductive post 240 and the conductive contact 235 may be reversed. That is, the post 240 may be conductive and the contact 235 may be non-conductive to allow the testing of the antenna rather than the electronic device, e.g., mobile terminal. In still other embodiments, both the post 240 and contact 235 may be conductive to allow for simultaneous testing of the antenna and the electronic device. Such a probe may comprise additional circuitry to ensure that there is limited mutual coupling between the two signal lines associated with the post 240 and contact 235.

Figure 3A:
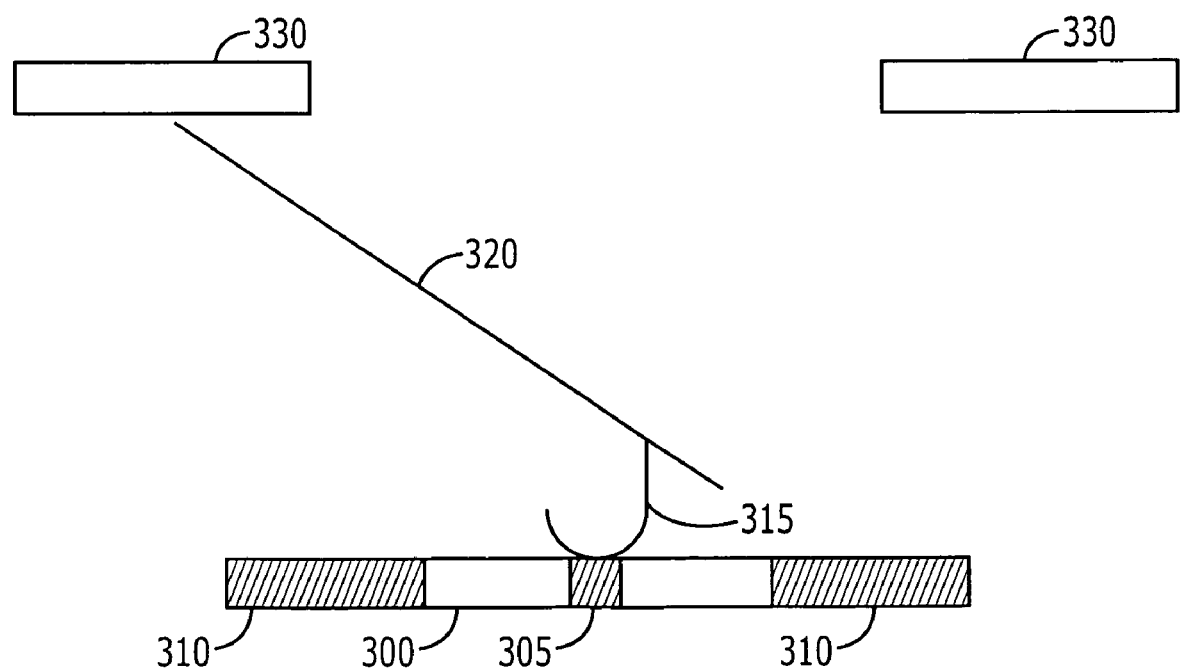
FIGS. 3A–3C illustrate a radio frequency test interface in accordance with further embodiments of the present invention.

Referring now to FIG. 3A, an exemplary radio frequency test interface for an electronic device, such as a mobile terminal, in accordance with further embodiments of the present invention, comprises a circuit board 300 that comprises a radio frequency contact 305 and ground contacts 310. An antenna 315 comprises a resilient member 320 that urges the antenna 315 to engage the radio frequency contact 305 as shown in FIG. 3A. The electronic device includes an opening in a housing 330 thereof through which a test connector may be received therethrough.

Figure 3B:
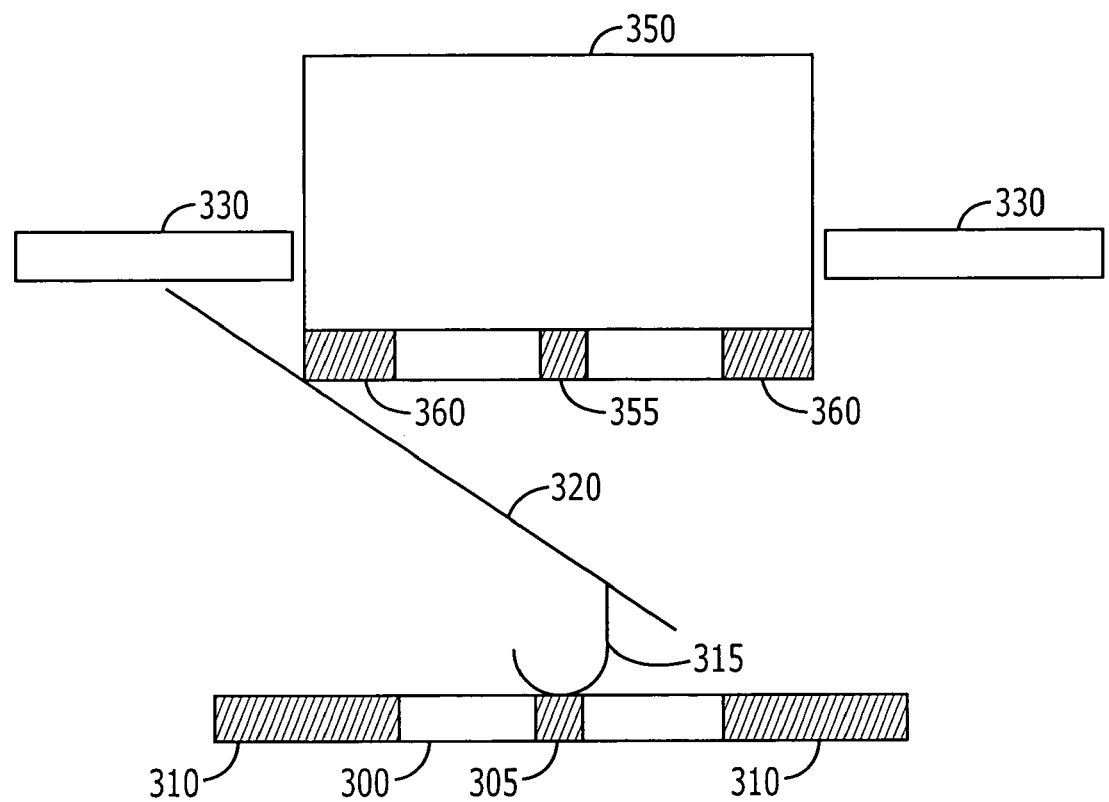
Figure 3C:
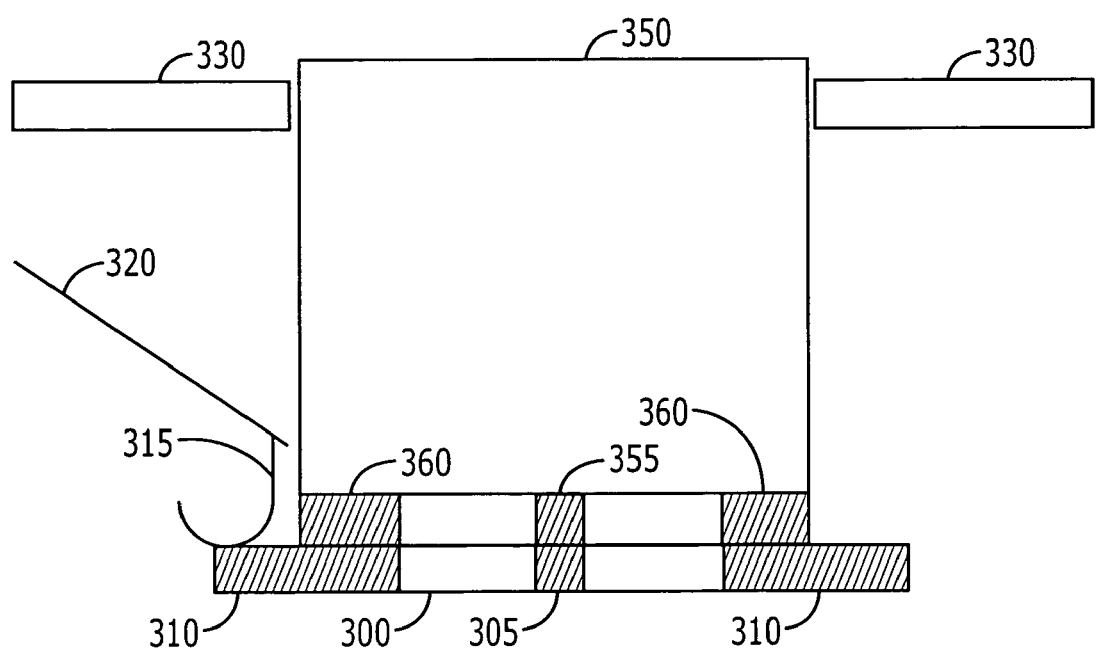

Referring now to FIG. 3B, a test connector 350 is illustrated that comprises a conductive contact 355, which may be configured to engage the radio frequency contact 305 of the circuit board 300, and contacts 360, which may be configured to engage the ground contacts 310 of the circuit board. The test connector 350 may be a 50 ohm test connector in accordance with some embodiments of the present invention. In particular, the test connector 350 may engage the resilient member 320 so as to displace the antenna 315 or similar component from the radio frequency contact 305. Note that in some embodiments the antenna connector and antenna may be separate components. In some embodiments of the present invention illustrated in FIG. 3B, the resilient member 320 is tapered so that when the test connector 350 engages the resilient member 320, the antenna 315 is displaced to the left of the radio frequency contact 305. This is further illustrated in FIG. 3C where the test connector 350 has fully displaced the antenna 315 by pushing the antenna 315 to the left via the resilient member 320. The conductive contact 355 engages the radio frequency contact 305 and the contacts 360 engage the ground contacts 310. The opening in the housing 330 or other alignment structure may be used to align the contacts 355 and 360 with the contacts 305 and 310, respectively. The resilient member 320 is configured to urge the antenna 315 back into engagement with the radio frequency contact 305 once the test connector 350 is removed. Advantageously, like the embodiments discussed above with respect to FIGS. 2A–2D, the radio frequency test interface embodiments of FIGS. 3A–3C may allow the radio frequency performance of an electronic device to be tested without the need for a separate RF connector.

Moreover, as discussed above with respect to FIGS. 2A–2D, in accordance with other embodiments of the present invention, the antenna 315 may comprise a first portion that is configured to engage and be disengaged from the radio frequency contact 305 and a second portion that is configured to engage and be disengaged from a matching component contact on the circuit board 300. The circuit board 300 may include impedance matching components thereon that may be used to tune the antenna for improved performance. These components are typically disconnected during radio frequency testing during manufacture or diagnostic testing. Thus, resilient member 320 may also disengage the second portion of the antenna 315 from the matching component contact when the test connector 350 engages the resilient member 320.

In accordance with further embodiments of the present invention, the antenna 315 may comprise a third portion, instead of or in addition to the second portion discussed above, that is configured to engage the ground contact 310 of the circuit board 300 or to ground a parasitic radiating element. This may be particular useful when the antenna 315 is a planar inverted-F type antenna. This connection between the third antenna portion and the ground contact 310 need not be disconnected during radio frequency testing; therefore, the third antenna portion is configured so as to remain engaged with the ground contact 310 when the test connector 350 engages the resilient member 320.

In the drawings and specification, there have been disclosed exemplary embodiments of the invention. Although specific terms are used, they are used in a generic and descriptive sense only and not for purposes of limitation, the scope of the invention being defined by the following claims.

That which is claimed:

1. A radio frequency test interface for an electronic device, comprising:

a circuit board that comprises a radio frequency contact and having an opening that extends therethrough;

an antenna that is configured to engage the radio frequency contact; and a test connector that comprises a conductive contact that is configured to engage the radio frequency contact and a non-conductive post that is configured to be received through the opening in the circuit board to disengage the antenna from the radio frequency contact.

2. The radio frequency test interface of claim 1, wherein the radio frequency contact extends through the circuit board and the conductive contact is configured to engage the radio frequency contact on a first side of the circuit board and the antenna is configured to engage the radio frequency contact on a second side of the circuit board.

3. The radio frequency test interface of claim 1, wherein the antenna comprises an antenna contact, which comprises a leaf-spring.

4. The radio frequency test interface of claim 1, wherein the test connector is a spring-loaded test connector.

5. The radio frequency test interface of claim 1, wherein the circuit board further comprises a ground contact and wherein the conductive contact is a first conductive contact and the test connector further comprises a second conductive contact that is configured to engage the ground contact.

6. The radio frequency test interface of claim 1, wherein the circuit board further comprises a matching component contact, wherein the antenna comprises a first portion that is configured to engage the radio frequency contact and a second portion that is configured to engage the matching component contact, and wherein the non-conductive post is configured to be received through the opening in the circuit board to disengage the first antenna portion from the radio frequency contact.

7. The radio frequency test interface of claim 1, wherein the circuit board further comprises a ground contact, wherein the antenna comprises a first portion that is configured to engage the radio frequency contact and a second portion that is configured to engage the ground contact, and wherein the non-conductive post is configured to be received through the opening in the circuit board to disengage the first antenna portion from the radio frequency contact.

8. The radio frequency test interface of claim 7, wherein the antenna is a planar inverted F antenna.

9. The radio frequency test interface of claim 1, wherein the test connector is a 50 ohm test connector.

10. The radio frequency test interface of claim 1, wherein the electronic device is a mobile terminal.

11. A radio frequency test interface for an electronic device, comprising:
a circuit board that comprises a radio frequency contact;
an antenna that comprises a resilient member that urges the antenna to engage the radio frequency contact; and
a test connector that comprises a conductive contact and is configured to engage the resilient member so as to displace the antenna from the radio frequency contact to allow the conductive contact to engage the radio frequency contact.

12. The radio frequency test interface of claim 11, wherein the resilient member comprises a tapered portion and wherein the test connector is configured to engage the tapered portion of the resilient member.

13. The radio frequency test interface of claim 11, further comprising:
an alignment structure that is configured to receive the test connector therethrough so as to position the conductive contact in alignment with the radio frequency contact.

14. The radio frequency test interface of claim 13, wherein the alignment structure comprises an opening in a housing of the electronic device.

15. The radio frequency test interface of claim 11, wherein the circuit board further comprises a ground contact and wherein the conductive contact is a first conductive contact and the test connector further comprises a second conductive contact that is configured to engage the ground contact.

16. The radio frequency test interface of claim 11, wherein the circuit board further comprises a matching component contact, wherein the antenna comprises a first portion that is configured to engage the radio frequency contact and a second portion that is configured to engage the matching component contact, and wherein the test connector is configured to engage the resilient member so as to displace the first antenna portion from the radio frequency contact.

17. The radio frequency test interface of claim 11, wherein the circuit board further comprises a ground contact, wherein the antenna comprises a first portion that is configured to engage the radio frequency contact and a second portion that is configured to engage the ground contact, and wherein the test connector is configured to engage the resilient member so as to displace the first antenna portion from the radio frequency contact.

18. The radio frequency test interface of claim 17, wherein the antenna is a planar inverted F antenna.

19. The radio frequency test interface of claim 11, wherein the test connector is a 50 ohm test connector.

20. The radio frequency test interface of claim 11, wherein the electronic device is a mobile terminal.

21. A radio frequency test interface for an electronic device, comprising:
a circuit board that comprises a radio frequency contact and having an opening that extends therethrough;
an antenna that is configured to engage the radio frequency contact; and
a test connector that comprises a non-conductive contact that is configured to engage the radio frequency contact and a conductive post that is configured to be received through the opening in the circuit board to disengage the antenna from the radio frequency contact.

* * * * *